(12) United States Patent
Lee et al.

(10) Patent No.: US 7,082,058 B2
(45) Date of Patent: Jul. 25, 2006

(54) NON-VOLATILE SEMICONDUCTOR MEMORY DEVICE HAVING SENSE AMPLIFIER WITH INCREASED SPEED

(75) Inventors: Seung-Keun Lee, Gyeonggi-do (KR); Jin-Sung Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/991,042

(22) Filed: Nov. 16, 2004

(65) Prior Publication Data

US 2005/0111261 A1    May 26, 2005

(30) Foreign Application Priority Data

Nov. 24, 2003   (KR) ...................... 10-2003-0083427

(51) Int. Cl.
*G11C 11/34* (2006.01)

(52) U.S. Cl. .............................. 365/185.21; 365/185.22

(58) Field of Classification Search ........... 365/185.21, 365/185.22
See application file for complete search history.

(56) References Cited

U.S. PATENT DOCUMENTS

| | | | | |
|---|---|---|---|---|
| 6,055,187 A | * | 4/2000 | Dallabora et al. | ..... 365/185.21 |
| 6,275,961 B1 | * | 8/2001 | Roohparvar | ................ 714/718 |
| 6,504,761 B1 | | 1/2003 | Kai et al. | |

* cited by examiner

*Primary Examiner*—Michael T. Tran
(74) *Attorney, Agent, or Firm*—Marger Johnson & McCollom, P.C.

(57) ABSTRACT

In the non-volatile semiconductor memory device having a sense amplifier for sensing data stored in a selected memory cell by comparing cell current differences from a reference cell, a current sink unit coupled in parallel with a reference line and a data line are provided. The reference line connects between the reference cell and the sense amplifier, and the data line connects between the selected memory cell and the sense amplifier, where the current sink unit together increases currents of the reference line and the data line. Also, the device includes a sink current control unit having a configuration of a current mirror with the current sink unit, the sink current control unit consisting of a switching unit and being for controlling a sink current of the current sink unit. The device improves data sensing speed and controls sensing current in conformity with the characteristics of a memory cell.

23 Claims, 4 Drawing Sheets

NON-VOLATILE SEMICONDUCTOR MEMORY DEVICE HAVING SENSE AMPLIFIER WITH INCREASED SPEED

CROSS REFERENCE TO RELATED APPLICATIONS

This application claims priority from Korean Patent Application No. 2003-83427, filed on Nov. 24, 2003, the contents of which are hereby incorporated by reference for all purposes.

BACKGROUND OF THE INVENTION

1. Field of the Invention

This disclosure relates to a semiconductor memory device, and more particularly, to a non-volatile semiconductor memory device having a sense amplifier.

2. Description of the Related Art

Basic operations in a semiconductor memory device such as a DRAM(Dynamic Random Access Memory), an SRAM (Static Random Access Memory), or a flash memory, include reading and writing data. There are usually minor differences among the memory types for the write operation, but there is little difference in the read operation. The read operation in a typical semiconductor memory device is controlled by a read enable signal that is applied by a switch to a corresponding memory cell or data read path, which provides an indication of a data read operation. A memory cell is enabled by electrically connecting a bit line and a word line to the memory cell. A word line is a line that is connected to a gate of a memory cell transistor, and a bit line is a line that is connected to a source or drain of the cell transistor. Thus, the read operation for a specific memory cell in a memory cell array is obtained after enabling the corresponding word line and bit line.

A flash memory reads data by sensing current, which is different from a DRAM. A current sense amplifier capable of sensing and amplifying is used to read data in the flash memory.

A current mirror is one example of a current sense amplifier. A current mirror has a stable operation, which results from a high noise immunity and a low operating voltage. But it has a shortcoming, namely a relatively high current consumption. Furthermore, another shortcoming is its long sensing times. There have been prior efforts to reduce the current consumption and the sensing time of the data.

The shortcomings of the conventional current mirror type sense amplifier were partially improved by the disclosure of U.S. Pat. No. 6,504,761, titled 'Non-volatile semiconductor memory device improved sense amplification configuration'. This prior art is shown in FIG. 1.

As shown in FIG. 1, a non-volatile memory cell MC is connected to a sense amplifier unit 10 through a column selection transistor M5. The sense amplifier unit 10 includes an NMOS transistor M2, an inverter I1, PMOS transistors M1, M3, M6' and an NMOS diode M4.

The inverter I1 inverts a signal of a bit line BL. The NMOS transistor M2 is connected between a node N1 and the bit line BL, and has its gate receiving an output of the inverter I1. The PMOS transistor M1 is connected between a power source Vcc and the node N1, and has its gate connected to the node N1. The PMOS transistor M3 is connected between the power source Vcc and an output node N2, and has its gate connected to the node N1. The PMOS transistor M1 and the PMOS transistor M3 have a configuration of a current mirror. A transistor M6' is connected between the power source Vcc and the node N1, and is turned on or off by a control signal PC. The NMOS diode M4 is connected between the node N2 and a ground node. A sensing current flowing through the PMOS transistor M3 is converted to a voltage by the NMOS diode M4.

When a word line WL is selected and the column selection transistor M5 is turned on, a current of the memory cell MC is detected by the sense amplifier unit 10, and a sensing current is converted to a voltage. Sensed data (voltage) is output from the node N2. Thus, the data value of the memory cell MC is determined.

To precharge the bit line before a sense operation, the control signal PC is set low, thus turning on the PMOS transistor M6', which precharges the node N1 to the level of the power source Vcc. When the PMOS transistor M6' is turned on and the precharge operation is completed, the PMOS transistor M3 turns off. Thus, the current does not flow through the PMOS transistor M3 and the NMOS transistor M4, reducing current consumption during the precharging operation.

Although this sense amplifier reduces the consumption of current, it does not reduce the sensing time for sensing data. The sense amplifier of a conventional single ended system utilizes a current on the sensing node via a current mirror, and not a current flowing in a main cell and a reference cell. That is, this conventional sense amplifier has a configuration for sensing a voltage shifted by a current difference.

The time it takes to sense data stored in a memory cell depends upon how quickly the sensed current reaches a stabilized state. For example, if the cell transistor is in an on-state, then data sensing is valid when the data sensing current is above a determined reference current. That is, when the sensed current begins to be in a steady state, the current sensed for an on-cell is greater than the reference current. Conversely, a current sensed for an off-cell is less than the reference current. A precharge time is defined as the time it takes for the reference current flowing in the reference cell and the cell current flowing in the memory cell to become equal to a precharge current.

In order to sense the memory cell in the sense amplifier, the precharge is started by supplying current to the data line through a PMOS load. The bit line is charged by the supply of the precharge current, thus a precharge voltage increases and a current flows to the sensing memory cell. At this time, in sensing a cell having a high threshold voltage Vt, the current flowing in the cell is very small, and so the precharge time is very long.

FIG. 2 is a graph illustrating a precharge time for on-cell and off-cell. In FIG. 2, the horizontal axis represents time and the vertical axis represents current.

As shown in FIG. 2, there is a problem that the precharge time t2 for the off cell is longer than a precharge time t1 for the on cell. That is, the precharge time t2 for the off cell becomes the total precharged time of the sense amplifier. Reducing this precharge time can reduce the data sensing time.

The precharge time can be reduced by decreasing the current consumption during the sensing operation and simultaneously enabling a sensed current to reach a steady state in a shorter time. Thereby a semiconductor memory device capable of increasing data sensing speed is desired.

SUMMARY OF THE INVENTION

Some embodiments of the invention provide a semiconductor memory device having a sense amplifier. The semiconductor memory device increases data sensing speed without the additional current consumption, and variably controls a sensing current in conformity with the state of the memory cell.

BRIEF DESCRIPTION OF THE DRAWINGS

The above and other features of exemplary embodiments of the invention will become readily apparent from the description that follows, with reference to the attached drawings in which.

DETAILED DESCRIPTION OF THE INVENTION

Hereinafter, an exemplary embodiment of the invention will be described in detail with reference to FIGS. 3 to 6. This invention may be embodied in many different forms and should not be construed as being limited to exemplary embodiments set forth herein; rather, these example embodiments are provided so that this disclosure is thorough and complete, and conveys the concept of the invention to those skilled in the art.

Figure 1:
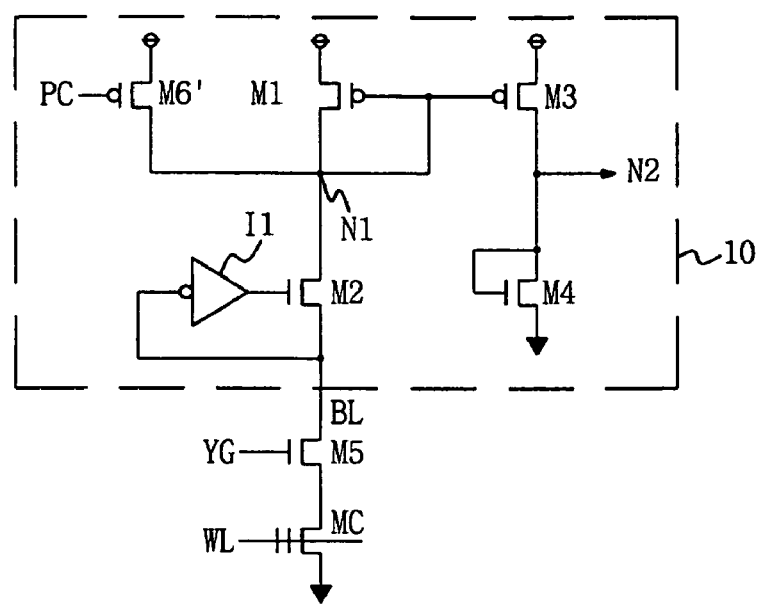
FIG. 1 is a schematic diagram illustrating the configuration of a sense amplifier according to the conventional art.
Figure 2:
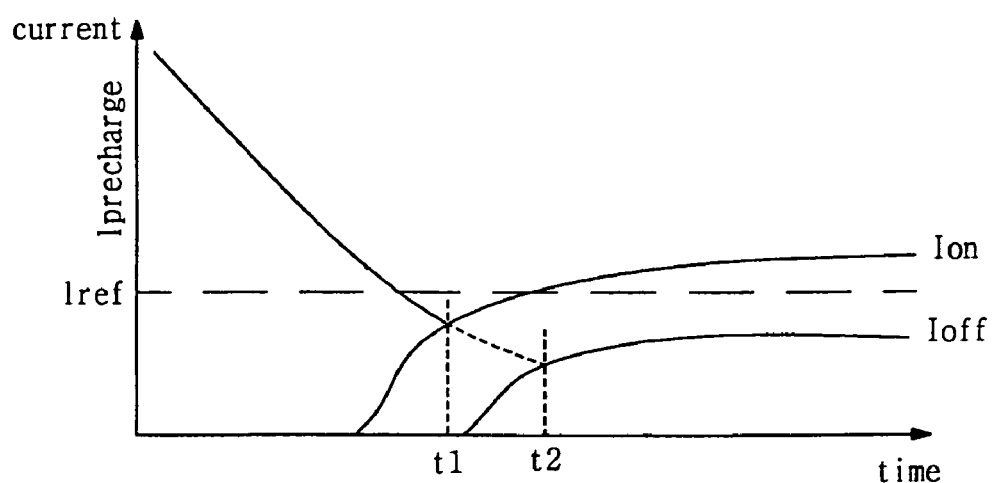
FIG. 2 is a graph illustrating the precharge time in a sense amplifier of the conventional art.
Figure 3:
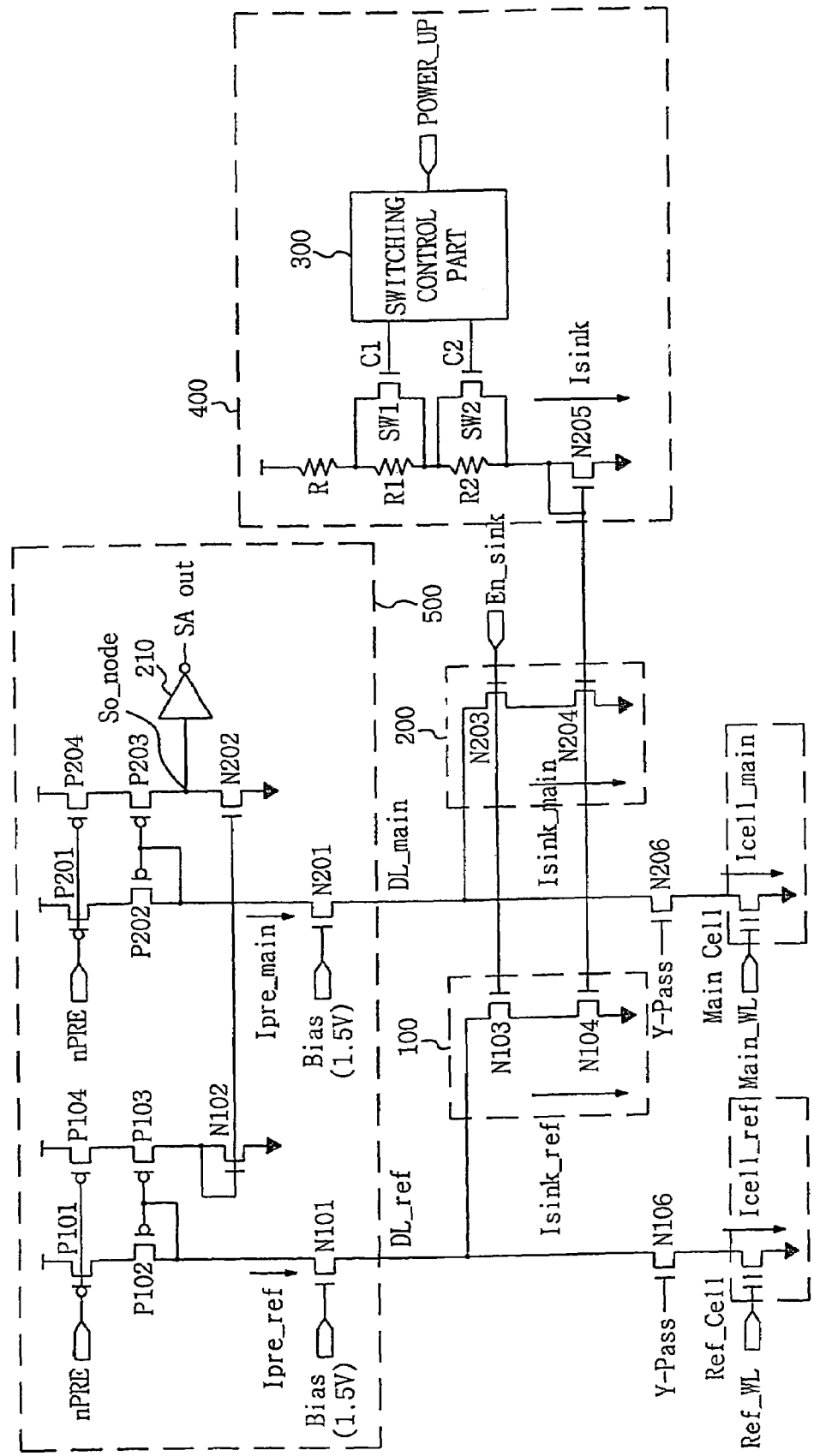
FIG. 3 is a block diagram schematically showing the configuration of a semiconductor memory device according to an example embodiment of the invention.

FIG. 3 illustrates the configuration of a semiconductor memory device according to an example embodiment of the invention.

Referring to FIG. 3, a semiconductor memory device is composed of a sense amplifier unit 500, a current sink unit 100, 200 and a sink current control unit 400. The current sink unit is constructed of a first current sink part 100 and a second current sink part 200.

The sense amplifier unit 500 is connected to a column selection transistor N206 through a data line DL_main, and the column selection transistor N206 is connected to a specific memory cell Main Cell by a word line selection signal Main WL and a column selection signal Y-Pass. A reference cell Ref_Cell is connected to the sense amplifier unit 500 through a reference column selection transistor N106 and a reference line DL_ref connected to the reference column selection transistor N106. The first current sink part 100 is coupled in parallel to the reference line DL_ref, connected to a node between the sense amplifier unit 500 and the reference cell Ref_Cell. The second current sink part 200 is coupled in parallel to the data line DL_main, connected to a node between the sense amplifier unit 500 and the memory cell Main Cell. The sink current control unit 400 is connected to the first current sink part 100 and the second current sink part 200 as a current mirror type, to control sink current.

The sense amplifier unit 500 is constructed of PMOS transistors (P101,P102,P103,P104,P201,P202,P203,P204), NMOS transistors (N101,M102,N201,N202) and an inverter 210.

The NMOS transistor N201 is connected between the data line DL_main, which is connected to the column selection transistor N206, and the PMOS transistor P202, and maintains the voltage of the data line DL_main as a determined voltage in response to a bias voltage Bias. The PMOS transistor P202 is connected between the NMOS transistor N201 and the PMOS transistor P201, and is configured with the PMOS transistor P203 as a current mirror type, to perform a precharge of the data line DL_main. The PMOS transistor P201 is connected between the PMOS transistor P202 and a power source Vcc, and receives a precharge signal nPRE through a gate thereof. The PMOS transistor P204 is connected between the power source Vcc and the PMOS transistor P203 and receives the precharge signal nPRE through a gate thereof. The PMOS transistor P203 is connected between the PMOS transistor P204 and the NMOS transistor N202, and is configured as a current mirror with the PMOS transistor P202. The NMOS transistor N202 is connected between the PMOS transistor P203 and ground, and is configured as a current mirror type with the NMOS transistor N102. The NMOS transistor N101 is connected between the reference line DL_ref, which is connected to the reference column selection transistor N106, and the PMOS transistor P102, and controls the voltage of the reference line DL_ref in response to the bias signal. The PMOS transistor P102 is connected between the NMOS transistor N101 and the PMOS transistor P101, and is configured as a current mirror type with the PMOS transistor P103 to perform a precharge of the reference line DL_ref. The PMOS transistor P101 is connected between the PMOS transistor P102 and the power source Vcc, and receives the precharge signal nPRE through a gate thereof. The PMOS transistor P104 is connected between the power source Vcc and the PMOS transistor P103, and receives the precharge signal nPRE through a gate thereof. The PMOS transistor P103 is connected between the PMOS transistor P104 and the NMOS transistor N102, and is configured as a current mirror type with the PMOS transistor P102. The NMOS transistor N102 is connected between the PMOS transistor P103 and ground, and is configured as a current mirror type with the NMOS transistor N202.

The first current sink part 100 is constructed of first and second NMOS transistors N103, N104. The first NMOS transistor N103 is connected between the reference line DL_ref and the second NMOS transistor N104, and receives a sink enable signal En_sink through a gate thereof. The second NMOS transistor N104 is connected between the first NMOS transistor N103 and ground, and has a current mirror type with a fifth NMOS transistor N205 of the sink current control unit 400, as described below.

The second current sink part 200 is constructed of third and fourth NMOS transistors N203, N204. The third NMOS transistor N203 is connected between the data line DL_main and the fourth NMOS transistor N204, and receives the sink enable signal En_sink through a gate thereof. The NMOS transistor N204 is connected between the third NMOS transistor N203 and ground, and is configured as a current mirror with the fifth NMOS transistor N205 of the sink current control unit 400, as described below.

Herewith, the first NMOS transistor N103 and the third NMOS transistor N203 have the same characteristics and size. Also the second NMOS transistor N104, the fourth NMOS transistor N204 and the fifth NMOS transistor N205 all have the same characteristics and size.

The sink current control unit 400 includes the fifth NMOS transistor N205, resistance elements R, R1, R2, switching units SW1, SW2, and a switching control part 300.

The fifth NMOS transistor N205 has the configuration of a current mirror type with the second NMOS transistor N104 of the first current sink part 100 and with the fourth NMOS transistor N204 of the second current sink part 200, and is connected between the resistance element R2 and ground. The resistance elements R, R1, R2 are connected between the power source and the fifth NMOS transistor N205 sequentially and in series. The switching unit SW1 is constructed of an NMOS transistor and is connected with both terminals of the resistance element R1, and receives a switching signal C1 of the switching control part 300 through a gate thereof. The switching unit SW2 is constructed of an NMOS transistor, and is connected with both terminals of the resistance element R2, and receives a switching signal C2 through a gate thereof. The switching control part 300 may be configured in various forms, and FIG. 4 illustrates one example for the configuration of the switching control part.

Figure 4:
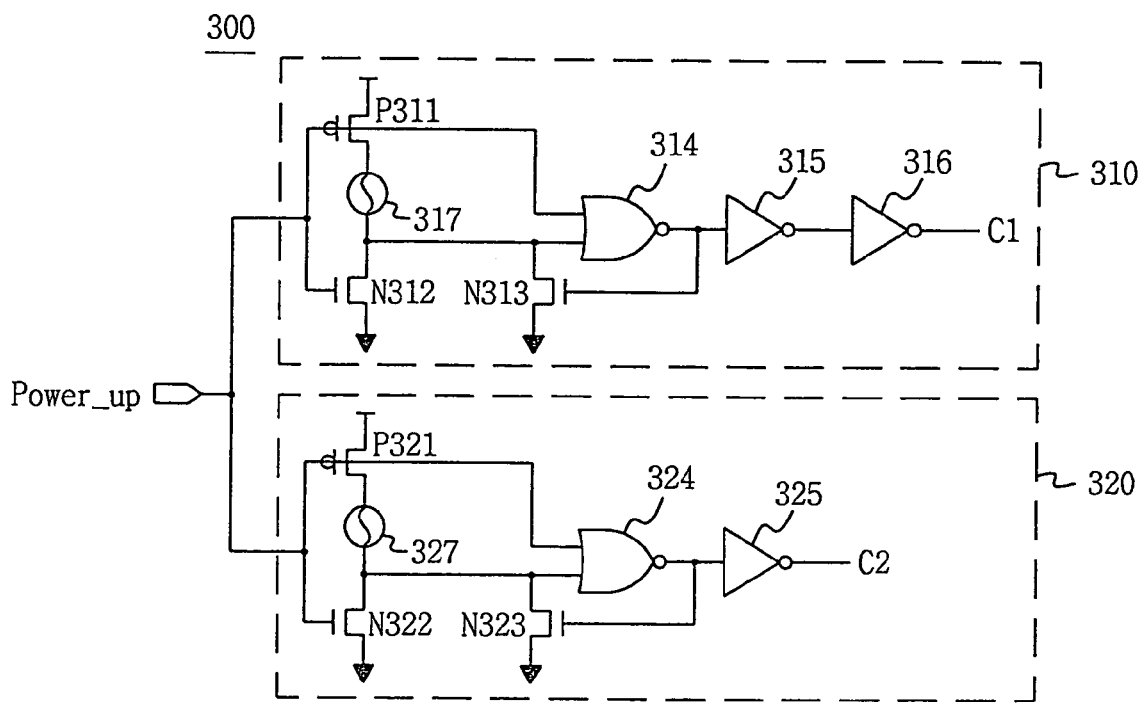
FIG. 4 is a block diagram schematically showing the configuration of a switching control part referred to FIG. 3.

With reference to FIG. 4, the switching control part 300 includes a first switching control block 310 and a second switching control block 320, the first switching control block 310 being for controlling the first switching unit SW1 and the second switching control block 320 being for controlling the second switching unit SW2. The first switching control block 310 is composed of a PMOS transistor P311, NMOS transistors (N312, N313), a fuse 317, a NOR gate 314 and inverters 315, 316. The second switching control block 320 is composed of a PMOS transistor P321, NMOS transistors (N322, N323), a fuse 327, a NOR gate 324 and an inverter 325.

The PMOS transistor P311 is connected between the power source Vcc and the fuse 317, and receives a switching start signal Power_up through the gate thereof. The NMOS transistor N312 is connected between the fuse 317 and ground, and receives the switching start signal Power_up through the gate thereof. The NOR gate 314 receives the switching start signal Power_up through one input terminal, and another input terminal thereof is connected to a node that is connected with the fuse 317 and the NMOS transistor N312. The inverter 315 is connected to the output terminal of the NOR gate 314, and the output terminal of the inverter 315 is connected to the input terminal of the inverter 316. The NMOS transistor N313 is connected between the input terminal of the NOR gate 314, which is connected to the fuse 317, and ground. The gate of the NMOS transistor N313 is connected to an output terminal of the NOR gate 314. The inverter 316 is connected to the output terminal of the inverter 315 through an input terminal thereof, and outputs the switching signal C1 through an output terminal thereof.

The PMOS transistor P321 is connected between the power source Vcc and the fuse 327, and receives the switching start signal Power_up through a gate thereof. The NMOS transistor N322 is connected between the fuse 327 and ground, and receives the switching start signal Power_up through its gate. The NOR gate 324 receives the switch start signal Power_up through one input terminal, and another input terminal thereof is connected to a node that is connected with the fuse 327 and the NMOS transistor 322. The NMOS transistor N323 is connected between an input terminal of the NOR gate 324, which is connected to the fuse 327, and ground, and a gate thereof is connected to an output terminal of the NOR gate 324. The inverter 325 is connected to the output terminal of the NOR gate 324 through an input terminal thereof, and outputs the switching signal C2 through an output terminal thereof. The fuses may be wed to select a standby current level.

The semiconductor memory device, which is provided with the sense amplifier having the above-described configuration, operates as follows.

As shown in FIG. 3, when the precharge signal nPRE is applied low, the PMOS transistors P101, P201 are turned on, and a precharge of the reference line DL_ref and the data line DL_main begins through the PMOS transistors P102, P202. As the precharging progresses, the voltage of the reference line DL_ref and the data line DL_main reach the same voltage as the applied voltage Bias minus the threshold voltage Vt of the NMOS transistors N101 and N201, respectively, and this is the steady-state. When the voltage of reference line DL_ref and data line DL_main reaches the steady-state, a current Ipre_ref flowing through the PMOS transistor P102 becomes equal to the current obtained by adding up Icell_ref flowing in the reference cell Ref_Cell, and a first sink current Isink_ref of the first current sink part 100 that operates by a sink enable signal En_sink applied simultaneously to the precharge signal nPRE. Furthermore, a current Ipre_main flowing through the PMOS transistor P202 becomes equal to the current obtained by adding up the current Icell_main flowing in the memory cell Main Cell, and a second sink current Isink_main of the second current sink part 200 that operates by the sink enable signal En_sink. Thus, the current flowing in the reference line DL_REF and the data line DL_main increases by the quantity of the first sink current Isink_ref and the second sink current Isink_main, respectively, as compared with the conventional art. That is, the precharge time is reduced to a precharge time corresponding to the increased current quantity.

The current obtained by adding up the current Icell_ref flowing in the reference cell Ref_Cell and the first sink current Isink_ref is the same as the current flowing in the NMOS transistor N102, and becomes the same as the current flowing through the NMOS transistor N202 by the current mirror. Furthermore, the current obtained by adding up a current flowing in the memory cell Main Cell Icell_main and the second sink current Isink_main becomes the same as the current flowing through the PMOS transistor P203 by the current mirror. Data of the memory cell Main Cell is outputted to the inverter 210 and is sensed by using the voltage variation of the sensing node So_node based on the difference between the current Icell_ref flowing in the reference cell Ref_Cell and the current Icell_main flowing in the memory cell Main Cell.

It is important to control the sink current in order to obtain an accurate operation of the sense amplifier. The first current sink part 100 and the second current sink part 200 operate by the sink enable signal En-sink, and additional current consumption can be prevented by operating only when the sense amplifier operates.

The first sink current Isink_ref and the second sink current Isink_main are simultaneously controlled as the same current quantity, by controlling a third sink current Isink flowing in the fifth NMOS transistor N205 of the sink current control unit 400 which has a current mirror with the second NMOS transistor N104 of the first current sink part 100 and the fourth NMOS transistor N204 of the second current sink part 200.

A current quantity of the third sink current Isink increases or decreases through an opening or closing of the switching unit SW1, SW2. The opening and closing of the switching unit SW1, SW2 is controlled by a combination of the control signals C1, C2 outputted from the switching control part 300. As shown in FIG. 4, the switching control part 300 generates the switching control signals C1, C2 by using a fuse. The input signal power_up is a pulse generated when the semiconductor chip is entirely powered on, and is maintained in a low state after the power-on. In the first switching control block 310 of the switching control part 300, the output signal C1 is maintained as a low state when a fuse 317 is closed, or is maintained as a high state when the fuse 317 is opened. In the second switching control block 320, the output signal C2 is maintained as a high state when fuse 327 is closed, or is maintained as a low state when fuse 327 is opened. The third sink current Isink can increase or decrease by a state of the memory cell based on this configuration of the switching control part 300.

Figure 5:
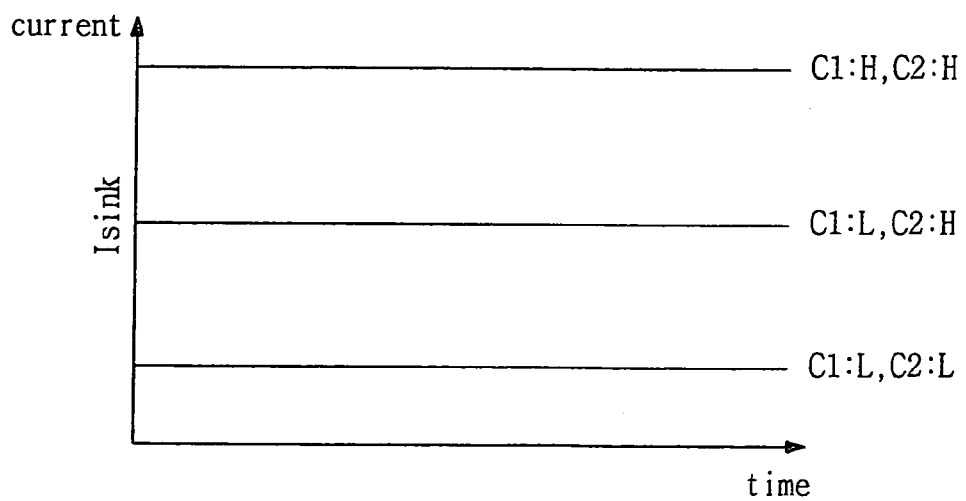
FIG. 5 is a graph showing a shift of the sink current through a switching operation referred to FIG. 4.

FIG. 5 illustrates the third sink current's dependence on the control signals C1, C2. The horizontal axis represents time and the vertical axis represents current. As shown in FIG. 5, if all levels of the control signals C1, C2 are low, the least current flows, and if all levels of the control signals C1, C2 are high, the most current flows. If levels of the controls signals C1, C2 are different, a medium current flows.

The logical configuration of FIG. 5 provides an example of the configuration of the switching control part referred to FIG. 4. Thus, various logical configurations can be provided through diverse designs of the switching control part.

Figure 6:
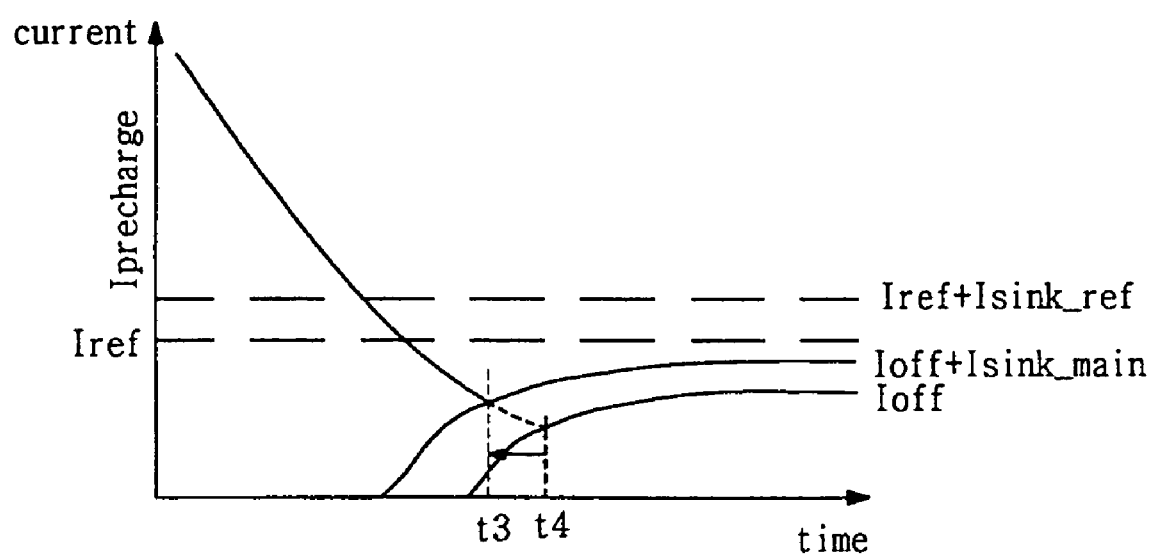
FIG. 6 is a graph illustrating the precharge time referred to FIG. 3.

FIG. 6 is a graph that illustrates the precharge time based on the conventional technique and the precharge time based on an example embodiment of the invention, for an off cell. Recall that the longer precharge time for an off-cell is the upper limit for the precharge time, as opposed to an on-cell. Thus shorter off-cell precharge times demonstrate an overall faster sensing speed.

As shown in FIG. 6, by utilizing the current sink unit that generates a sink current to the sense amplifier, as in the invention, the current Ioff+Isink_main flowing in the data line increases more quickly than the current Ioff of a data line without the current sink unit. Thus, the precharge time t4, the case without a current sink unit, is shortened to the precharge time t3, the case of utilizing a current sink unit.

In this configuration, the sink current can be appropriately controlled to improve the sensing speed even in case the state of the memory cell is changed.

As was described above, according to some embodiments of the invention, the data sensing speed can increase by shortening the precharge time of the data line, and the sensing current is variably controlled in conformity with the state of a memory cell to also control the sensing speed.

In addition, there is an advantage of controlling, as well as, increasing, the data sensing speed.

Embodiments of the invention may be practiced in many ways. What follows are exemplary, non-limiting descriptions of some of these embodiments.

An embodiment of the invention provides a non-volatile semiconductor memory device having a sense amplifier that senses data stored in a selected memory cell by comparing cell current differences from a reference cell. The semiconductor memory device includes a current sink unit coupled in parallel with a reference line and a data line, the reference line being for connecting between the reference cell and the sense amplifier, and the data line being for connecting between the selected memory cell and the sense amplifier, where the current sink unit together increases currents of the reference line and the data line; and a sink current control unit having a current mirror type with the current sink unit, the sink current control unit being provided with a switching unit and being for controlling a sink current of the current sink unit.

Another embodiment of the invention provides a non-volatile semiconductor memory device having a sense amplifier that senses data stored in a selected memory cell by comparing cell current differences from a reference cell. The semiconductor memory device includes a sink current control unit provided with a switching unit, the sink current control unit being for generating a control signal that controls a sink current; and a current sink unit coupled in parallel with a reference line and a data line, the reference line being for connecting between the reference cell and the sense amplifier, and the data line being for connecting between the selected memory cell and the sense amplifier, where the current sink unit has a current mirror type with the sink current control unit, and together increases currents of the reference line and the data line in response to the control signal of the sink current control unit.

Herewith, the current sink unit may be composed of a first current sink part coupled in parallel to the reference line for connecting between the reference cell and the sense amplifier, the first current sink part being for increasing the current of the reference line; and a second current sink part coupled in parallel to the data line for connecting between the selected memory cell and the sense amplifier, the second current sink part being for increasing the current of the data line. The sink current control unit may be constructed of an NMOS transistor, a plurality of resistance elements, a switching unit for controlling a connection state of the resistance elements, and a switching control part for controlling the switching unit. The switching control part can control each connection state of the resistance elements through an opening or a closing of a fuse, and the sense amplifier may have a current mirror type.

The structural configuration of the invention can increase the sensing speed of the sense amplifier and can control the sensing current in conformity with the state of the memory cell.

It will be apparent to those skilled in the art that modifications and variations can be made to the exemplary embodiments without deviating from the spirit or scope of the invention. Thus, it is intended that the invention cover any such modifications and variations of this invention provided they come within the scope of the appended claims and their equivalents. For example, in other cases, an internal configuration of the circuit may be changed or internal elements of the circuit may be replaced by other equivalent elements. Accordingly, these and other changes and modifications are seen to be within the true spirit and scope of the invention as defined by the appended claims.

The invention claimed is:

1. A non-volatile semiconductor memory device having a sense amplifier that senses data stored in a selected memory cell by comparing cell current differences to a reference cell, the semiconductor memory device comprising:
   a current sink unit coupled in parallel with a reference line and a data line, wherein the reference line connects between the reference cell and the sense amplifier, and the data line connects between the selected memory cell and the sense amplifier, wherein the current sink unit modifies currents of the reference line and the data line; and
   a sink current control unit having a configuration of a current mirror together with the current sink unit, the sink current control unit having a switching unit for controlling a sink current of the current sink unit that is responsive to switching signals generated by the sink current control unit.

2. The device as claimed in claim 1, wherein the sense amplifier is a current mirror type.

3. The device as claimed in claim 1, wherein the current sink unit comprises:

a first current sink part coupled in parallel to the reference line for connecting between the reference cell and the sense amplifier, the first current sink part for increasing a current of the reference line; and a second current sink part coupled in parallel to the data line for connecting between the selected memory cell and the sense amplifier, the second current sink part for increasing a current of the data line.

4. A non-volatile semiconductor memory device having a sense amplifier that senses data stored in a selected memory cell by comparing cell current differences to a reference cell, the semiconductor memory device comprising:

a current sink unit coupled in parallel with a reference line and a data line, wherein the reference line connects between the reference cell and the sense amplifier, and the data line connects between the selected memory cell and the sense amplifier, wherein the current sink unit together increases currents of the reference line and the data line; and a sink current control unit having a configuration of a current mirror together with the current sink unit, the sink current control unit having a switching unit for controlling a sink current of the current sink unit, wherein the current sink unit comprises:

a first current sink part coupled in parallel to the reference line for connecting between the reference cell and the sense amplifier, the first current sink part for increasing a current of the reference line; and a second current sink part coupled in parallel to the data line for connecting between the selected memory cell and the sense amplifier, the second current sink part for increasing a current of the data line, wherein the first current sink part is constructed of a first NMOS transistor connected to the reference line and responding to a sink current enable signal, and a second NMOS transistor connected in series to the first NMOS transistor.

5. The device as claimed in claim 4, wherein the second current sink part is constructed of a third NMOS transistor connected to the data line and responding to the sink current enable signal, and a fourth NMOS transistor connected in series to the third NMOS transistor.

6. The device as claimed in claim 5, wherein the sink current control unit comprises a fifth NMOS transistor that has a current mirror type with the second NMOS transistor and the fourth NMOS transistor.

7. The device as claimed in claim 6, wherein the sink current control unit comprises a plurality of resistance elements connected between the fifth NMOS transistor and a power source, a switching unit for controlling a connection state of the resistance elements, and a switching control part for controlling the switching unit.

8. The device as claimed in claim 7, wherein the switching control part controls an individual connection state of the resistance elements by an opening or closing of a fuse.

9. The device as claimed in claim 8, wherein the first NMOS transistor and the third NMOS transistor have the same characteristics and size.

10. The device as claimed in claim 8, wherein the second NMOS transistor, the fourth NMOS transistor and the fifth NMOS transistor have the same characteristics and size.

11. A non-volatile semiconductor memory device having a sense amplifier that senses data stored in a selected memory cell by comparing cell current differences to a reference cell, the semiconductor memory device comprising:

a sink current control unit for generating a control signal that controls a sink current, the sink current control unit including a switching unit; and a current sink unit coupled in parallel with a reference line and a data line, wherein the reference line connects between the reference cell and the sense amplifier and the data line connects between the selected memory cell and the sense amplifier, where the current sink unit has a configuration of a current mirror with the sink current control unit, and modifies currents of the reference line and the data line in response to a control signal of the sink current control unit that is responsive to switching signals generated by the sink current control unit.

12. The device as claimed in claim 11, wherein the sense amplifier is a current mirror type.

13. The device as claimed in claim 12, wherein the current sink unit comprises:

a first current sink part coupled in parallel to the reference line for connecting between the reference cell and the sense amplifier, the first current sink part for increasing a current of the reference line; and a second current sink part coupled in parallel to the data line for connecting between the selected memory cell and the sense amplifier, the second current sink part for increasing a current of the data line.

14. A non-volatile semiconductor memory device having a sense amplifier that senses data stored in a selected memory cell by comparing cell current differences to a reference cell, the semiconductor memory device comprising:

a sink current control unit for generating a control signal that controls a sink current, the sink current control unit including a switching unit; and a current sink unit coupled in parallel with a reference line and a data line, wherein the reference line connects between the reference cell and the sense amplifier and the data line connects between the selected memory cell and the sense amplifier, where the current sink unit has a configuration of a current mirror with the sink current control unit, and together increases currents of the reference line and the data line in response to a control signal of the sink current control unit, wherein the current sink unit comprises:

a first current sink part coupled in parallel to the reference line for connecting between the reference cell and the sense amplifier, the first current sink part for increasing a current of the reference line; and a second current sink part coupled in parallel to the data line for connecting between the selected memory cell and the sense amplifier, the second current sink part for increasing a current of the data line, wherein the first current sink part is constructed of a first NMOS transistor connected to the reference line and responding to a sink current enable signal, and a second NMOS transistor connected in series to the first NMOS transistor.

15. The device as claimed in claim 14, wherein the second current sink part is constructed of a third NMOS transistor connected to the data line and responding to the sink current enable signal, and a fourth NMOS transistor connected in series to the third NMOS transistor.

16. The device as claimed in claim 15, wherein the sink current control unit comprises a fifth NMOS transistor that has a current mirror type with the second NMOS transistor and the fourth NMOS transistor.

17. The device as claimed in claim 16, wherein the sink current control unit comprises a plurality of resistance elements connected between the fifth NMOS transistor and a power source, a switching unit for controlling a connection state of the resistance elements, and a switching control part for controlling the switching unit.

18. The device as claimed in claim 17, wherein the switching control part controls an individual connection state of the resistance elements by an opening or closing of a fuse.

19. The device as claimed in claim 18, wherein the first NMOS transistor and the third NMOS transistor have the same characteristics and size.

20. The device as claimed in claim 18, wherein the second NMOS transistor, the fourth NMOS transistor and the fifth NMOS transistor have the same characteristics and size.

21. A non-volatile semiconductor memory device having a sense amplifier that senses data stored in a selected memory cell by comparing cell current differences to a reference cell, the semiconductor memory device comprising:
 a current sink unit coupled in parallel with a reference line and a data line, wherein the reference line connects between the reference cell and the sense amplifier, and the data line connects between the selected memory cell and the sense amplifier, wherein the current sink unit together increases currents of the reference line and the data line; and
 a sink current control unit having a configuration of a current mirror together with the current sink unit, the sink current control unit having a switching unit for controlling a sink current of the current sink unit,
 wherein the current sink unit comprises:
  a first current sink part coupled in parallel to the reference line for connecting between the reference cell and the sense amplifier, the first current sink part for increasing a current of the reference line; and
  a second current sink part coupled in parallel to the data line for connecting between the selected memory cell and the sense amplifier, the second current sink part for increasing a current of the data line, wherein the first current sink part is constructed of a first transistor connected to the reference line and responding to a sink current enable signal.

22. The device as claimed in claim 21, wherein the second current sink part is constructed of a second transistor connected to the data line and responding to the sink current enable signal.

23. The device as claimed in claim 21, wherein the current sink unit is responsive to a sink current enable signal.

* * * * *